United States Patent
Li (10) Patent No.: US 7,910,177 B2
(45) Date of Patent: Mar. 22, 2011

(54) SEQUENTIAL PULSE DEPOSITION

(75) Inventor: Weimin Li, Boise, ID (US)

(73) Assignee: Mosaid Technologies Incorporated, Ottawa (CA)

( * ) Notice: Subject to any disclaimer, the term of this patent is extended or adjusted under 35 U.S.C. 154(b) by 941 days.

(21) Appl. No.: 11/496,093

(22) Filed: Jul. 31, 2006

(65) Prior Publication Data

US 2006/0265100 A1 Nov. 23, 2006

Related U.S. Application Data

(62) Division of application No. 10/232,270, filed on Aug. 28, 2002, now abandoned, which is a division of application No. 09/782,207, filed on Feb. 13, 2001, now Pat. No. 6,613,656.

(51) Int. Cl.
*C23C 8/00* (2006.01)

(52) U.S. Cl. ........ 427/585; 427/588; 427/96.8; 438/758

(58) Field of Classification Search ................ 427/509, 427/585, 588, 96.8; 438/758
See application file for complete search history.

(56) References Cited

U.S. PATENT DOCUMENTS

| | | | |
|---|---|---|---|
| 4,058,430 A | 11/1977 | Suntola et al. |
| 4,413,022 A | 11/1983 | Suntola et al. |
| 4,747,367 A | 5/1988 | Posa |
| 4,888,199 A | 12/1989 | Felts et al. |
| 5,102,694 A | 4/1992 | Taylor et al. |
| 5,138,520 A | 8/1992 | McMillan et al. |
| 5,146,299 A | 9/1992 | Lampe et al. |
| 5,164,040 A | 11/1992 | Eres et al. |
| 5,173,327 A | 12/1992 | Sandhu et al. |
| 5,227,331 A | 7/1993 | Westmoreland |
| 5,240,739 A | 8/1993 | Doan et al. |
| 5,254,499 A | 10/1993 | Sandhu et al. |
| 5,255,258 A | 10/1993 | Kawade et al. |
| 5,261,963 A | 11/1993 | Basta et al. |
| 5,278,100 A | 1/1994 | Doan et al. |
| 5,330,610 A | 7/1994 | Eres et al. |
| 5,368,685 A | 11/1994 | Kumihashi et al. |
| 5,376,405 A | 12/1994 | Doan et al. |
| 5,382,550 A | 1/1995 | Iyer |
| 5,439,876 A | 8/1995 | Graf et al. |
| 5,445,699 A | 8/1995 | Kamikawa et al. |
| 5,451,260 A | 9/1995 | Versteeg et al. |
| 5,453,494 A | 9/1995 | Kirlin et al. |
| 5,480,684 A | 1/1996 | Sandhu |
| 5,571,572 A | 11/1996 | Sandhu |
| 5,576,071 A | 11/1996 | Sandhu |
| 5,616,208 A | 4/1997 | Lee |
| 5,648,321 A | 7/1997 | Bednorz et al. |
| 5,661,115 A | 8/1997 | Sandhu |

(Continued)

OTHER PUBLICATIONS

Buchholz, D., et al., "In-plane orientation control of $(001)YBa_2Cu_3O_7$- grown on (001)MgO by pulsed organometallic beam epitaxy", *App. Phys. Lett.*, 68(21), (1996), 3037-3039.

(Continued)

*Primary Examiner* — A. Sefer
*Assistant Examiner* — Allen L Parker
(74) *Attorney, Agent, or Firm* — Hamilton, Brook, Smith & Reynolds, P.C.

(57) ABSTRACT

A method for growing films on substrates using sequentially pulsed precursors and reactants, system and devices for performing the method, semiconductor devices so produced, and machine readable media containing the method.

38 Claims, 6 Drawing Sheets

U.S. PATENT DOCUMENTS

| | | | |
|---|---|---|---|
| 5,693,377 | A | 12/1997 | Westmoreland et al. |
| 5,733,816 | A | 3/1998 | Iyer et al. |
| 5,741,546 | A | 4/1998 | Sandu |
| 5,741,547 | A | 4/1998 | Akram et al. |
| 5,755,885 | A | 5/1998 | Mikoshiba et al. |
| 5,804,259 | A * | 9/1998 | Robles .......................... 427/577 |
| 5,874,131 | A | 2/1999 | Vaartstra et al. |
| 5,879,459 | A | 3/1999 | Gadgil et al. |
| 5,902,651 | A | 5/1999 | Westmoreland et al. |
| 5,924,012 | A | 7/1999 | Vaarstra |
| 5,972,430 | A * | 10/1999 | DiMeo et al. ............ 427/255.32 |
| 6,001,728 | A * | 12/1999 | Bhan et al. ..................... 438/624 |
| 6,010,969 | A * | 1/2000 | Vaartstra ....................... 438/758 |
| 6,063,705 | A | 5/2000 | Vaartstra |
| 6,071,572 | A | 6/2000 | Mosely et al. |
| 6,110,529 | A | 8/2000 | Gardiner et al. |
| 6,127,192 | A | 10/2000 | Uhlenbrock et al. |
| 6,133,161 | A | 10/2000 | Uhlenbrock et al. |
| 6,136,690 | A | 10/2000 | Li |
| 6,136,703 | A | 10/2000 | Vaartstra |
| 6,139,780 | A | 10/2000 | Desu et al. |
| 6,140,230 | A | 10/2000 | Li |
| 6,143,362 | A | 11/2000 | Sandhu et al. |
| 6,156,674 | A | 12/2000 | Li et al. |
| 6,198,144 | B1 | 3/2001 | Pan et al. |
| 6,200,893 | B1 * | 3/2001 | Sneh ............................ 438/685 |
| 6,204,172 | B1 | 3/2001 | Marsh |
| 6,214,729 | B1 | 4/2001 | Uhlenbrock et al. |
| 6,217,645 | B1 | 4/2001 | Vaartstra |
| 6,218,288 | B1 | 4/2001 | Li et al. |
| 6,225,237 | B1 | 5/2001 | Vaartstra |
| 6,239,028 | B1 | 5/2001 | Vaartstra |
| 6,273,954 | B2 | 8/2001 | Nishikawa et al. |
| 6,287,980 | B1 | 9/2001 | Hanazaki et al. |
| 6,305,314 | B1 | 10/2001 | Sneh et al. |
| 6,475,276 | B1 | 11/2002 | Elers et al. |
| 6,539,891 | B1 | 4/2003 | Lee et al. |
| 2001/0041250 | A1 * | 11/2001 | Werkhoven et al. .......... 428/212 |
| 2002/0052120 | A1 | 5/2002 | Shintani et al. |

OTHER PUBLICATIONS

Duray, S., et al., "Pulsed organometallic beam epitaxy of complex oxide films", *Appl. Phys. Lett.*, 59(12), (1991),pp. 1503-1505.

Fujii, K., et al., "Preparation of YBa$_2$Cu$_3$Ox Thin Films by Layer-by-Layer Metalorganic Chemical Vapor Deposition", *Jpn. J. Appl. Phys.*, 31, (1992),pp. L 787-L789.

Hirai, T., et al., "Preparation of Perovskite Oriented PbZrxTi$_1$-xO$_3$ Films with Suppressed Vapor Phase Reactions by a Digital Chemical Vapor Methos", *Jpn. J. Appl. Phys*, 34, (1995),pp. 539-543.

Ikegawa, S., et al., "Growth of CeO$_2$ thin films by metal-organic molecular beam epitaxy", *Thin Solid Films*, (1996),pp. 60-63.

Lang, F., et al., "Investigation of the film growth of a new titanium precursor for MOCVD", *Journal of Non-Crystalline Solids*, 187, (1995),pp. 430-434.

Sotome, Y., et al., "c-Axis-Oriented Pb(Zr, Ti)O$_3$ Thin Films Prepared by Digital Metalorganic Chemical Vapor Deposition Method", *Jpn. J. Appl. Phys.*, 33, (1994),pp. 4066-4069.

Versteeg, V., et al., "Metalorganic Chemical Vapor Deposition by Pulsed Liquid Injection Using an Ultrasonic Nozzle: Titanium Dioxide on Sapphire from Titanium(IV) Isopropoxide", *J. Am. Ceram. Soc.*, 78(10), (1995),pp. 2763-2768.

Xie, H., et al., "Epitaxial LiTaO$_3$ thin film by pulsed metalorganic chemical vapor deposition from a single precursor", *App. Phys. Lett.*, 63(23), (1993),pp. 3146-3148.

* cited by examiner

SEQUENTIAL PULSE DEPOSITION

RELATED APPLICATIONS

This application is a divisional of U.S. patent application Ser. No. 10/232,270, filed Aug. 28, 2002, now abandoned which is a divisional of U.S. patent application Ser. No. 09/782,207, filed Feb. 13, 2001, now U.S. Pat. No. 6,613,656, both of which are incorporated herein by reference.

FIELD OF THE INVENTION

The present invention relates to deposition techniques and, more particularly, to deposition techniques for forming thin films on wafers or substrates.

BACKGROUND OF THE INVENTION

Integrated circuits (IC) are often fabricated with one or more semiconductor devices, which may include diodes, capacitors, and different varieties of transistors. These devices are generally fabricated by creating thin films of various materials, e.g. metals, semiconductors or insulators, upon a substrate or semiconductor wafer. The terms wafer and substrate used in the following description include any semiconductor-based structure having an exposed surface with which to form an integrated circuit or semiconductor device, and may include one or more semiconductor layers or structures which includes active or operable portions of semiconductor devices. Wafer and substrate are used interchangeably to refer to semiconductor structures during processing, and may include other layers that have been fabricated thereon. The physical characteristics and tightly controlled placement of films on a substrate will define the performance of the semiconductor device and its surrounding circuitry.

Semiconductor fabrication continues to advance, requiring finer dimensional tolerances and control. Modern integrated circuit design has advanced to the point where line width may be 0.25 microns or less. As a result, repeatability and uniformity of processes and their results is becoming increasingly important.

One important process for depositing thin films on semiconductor wafers is chemical vapor deposition or CVD. CVD is used to form a thin film of a desired material from a reaction of vapor-phase chemicals containing the chemical constituents of the material.

CVD processes operate by confining one or more semiconductor wafers in a reaction chamber. The chamber is filled with one or more gases that surround the wafer. The gases for the deposition of metal and metal alloys includes a metal precursor and a reactant gas, e.g. an oxidizer or hydrogen gas, to be introduced into the chamber at the same time. Energy is supplied within the chamber and particularly to the reactant gases near the wafer surface. A typical energy is heat applied to the substrate. The energy activates the reactant gas chemistry to deposit a film from the gas onto the heated substrate. Such chemical vapor deposition of a solid onto a surface involves a heterogeneous surface reaction of the gaseous species that adsorb onto the surface. The rate of film growth and the quality of the film depend on the process conditions. Unfortunately, the metal precursor and the reactant gas also react during the gas phase. Such a gas phase reaction produces contaminants and/or involve a significant quantity of precursor so that an insufficient amount is available for deposition of the substrate. As a result, the gas phase reaction becomes dominant and the thin film coverage is poor.

Deposition of a film begins with nucleation as the atoms or molecules of the desired material begin to condense on the substrate and agglomerate to form nuclei. Growth of these nuclei will fill in the gaps between individual nuclei to develop a continuous surface or film. The gas phase reaction can also prevent the formation of a sufficient number of nuclei and/or the growth of the nuclei to fill the gaps therebetween due to insufficient reactions between the metal precursor and oxidizer at the surface of the wafer. For example, CVD techniques for depositing metal, e.g. platinum or platinum alloys, may result in non-uniform nucleation due to gas phase reaction of the metal gas and the oxidizer. Non-uniform nucleation can result in gaps and pinholes between grains and short some of the circuitry. Uniform nucleation is desirable to create a uniform film so that the electrical and mechanical properties of the film, and hence wafer and resulting circuitry, are predictable, accurate and reproducible.

Generally, it is desired to have thin films deposited on the wafer to save space. Yet reducing the thickness of films can result in pinholes and in less mechanical strength. One area of particular concern is step coverage. Due to the rapidly changing geography at these step interfaces, thinner films face a larger risk that the film will be too thin in some areas to achieve the desired performance characteristics. Thus, nominally thicker films are sometimes unavoidable to provide adequate step coverage where the deposition process encounters high aspect ratios for steps in the substrate topology. CVD techniques for depositing metal or metal alloys on substrates often result in poor step coverage, which can result in electrical shorts and/or unwanted inductances, loss of electrode area, or high resistance especially in high aspect trenches or holes.

Another development in the field of thin film technology for coating substrates is atomic layer deposition (ALD). A description of ALD is set forth in U.S. Pat. No. 5,879,459, which is herein incorporated by reference in its entirety. ALD operates by confining a wafer in a reaction chamber at a typical temperature of less than 300 degrees C. Precursor gas is alternatively, nonoverlappingly pulsed into the chamber, wherein the pulsed precursor forms a monolayer on the substrate by chemisorption. The low temperature limits the bonding of the precursor to chemisorption, thus only a single layer, usually only one atom or molecule thick, is grown on the wafer. Each pulse is separated by a purge pulse which completely purges all of the precursor gas from the chamber before the next pulse of precursor gas begins. Each injection of precursor gas provides a new single atomic layer on the previously deposited layers to form a layer of film. Obviously, this significantly increases the time it takes to depose a layer having adequate thickness on the substrate. As a numerical example, ALD has a typical deposition rate of about 100 Å/min and CVD has a typical deposition rate of about 1000 Å/min. For at least this reason, ALD has not met with widespread commercial acceptance.

In light of the foregoing, there is a need for fabrication of thin films which offer improved step coverage and effective fabrication rates.

DESCRIPTION OF THE EMBODIMENTS

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface onto which a layer is deposited according to the present invention, for example to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

According to the teachings of the present invention, fabrication of films on substrates, devices and systems for such fabrication, media containing instructions therefor, and integrated circuits produced according to the present invention are described.

The use, construction and fundamental operation of reactors for deposition of films are understood by those of ordinary skill in the art of semiconductor fabrication. The present invention may be practiced on a variety of such reactors without undue experimentation. Furthermore, one of ordinary skill in the art will comprehend the necessary detection, measurement, and control techniques in the art of semiconductor fabrication as well as the more inclusive art of industrial processing for producing films on substrates upon reading the disclosure.

It will be understood that the terms "precursor" and "reactant" are used herein to differentiate between a chemical compound that includes a metal component to be deposited on a substrate and a gas which reacts with the compound to deposit the metal component on a wafer. This nomenclature is used herein as a tool to clearly describe the invention as both the "precursor" and the "reactant" chemically react with each other to form the desired film on the substrate. Accordingly, the term "precursor" is not intended to imply a time relationship with the "reactant" unless explicitly described.

Figure 1:
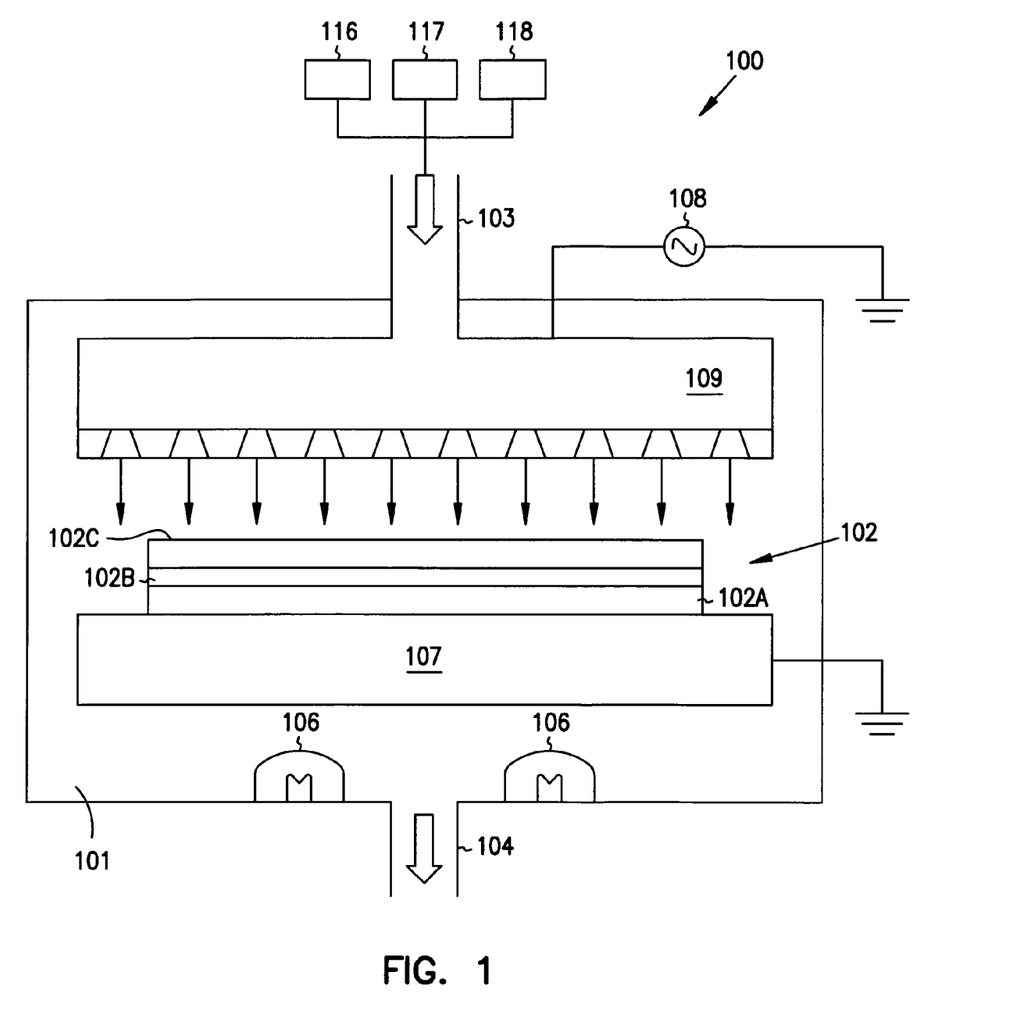
FIG. 1 is a schematic view of a deposition chamber which can be used to perform the process of the invention.

FIG. 1 depicts one embodiment of a vapor deposition (VD) reactor 100 suitable for practicing the invention. FIG. 1 is provided for illustrative purposes and the invention is by no way limited to the VD reactor shown herein. One of ordinary skill in the art will comprehend other suitable reactors for practicing the invention described in this application. The embodiment shown in FIG. 1 includes a chamber 101 that is a pressure-sealed compartment for mounting a substrate 102 on susceptor 107. Chamber 101 is typically manufactured from aluminum and is designed to contain a low-pressure environment around substrate 102 as well as to contain process gases, exhaust gases, and heat or plasma energy within chamber 101. The illustrated substrate 102 includes a substrate base 102A on which are deposited first and second layers 102B and 102C. Inlet gas manifold 103 supplies process gases, for example precursor gases and/or reactant gases, at a controlled flow rates to substrate 102. A source of precursor gas 116 is connected to manifold 103. A source of purge gas 117 is connected to manifold 103. A source of reactant gas 118 is also connected to manifold 103. Carrier gases, such as helium, argon or nitrogen, may also be supplied in conjunction with the gases supplied by the manifold as is known and understood by one of ordinary skill in the art. Chamber 101 also incorporates a pumping system (not shown) for exhausting spent gases from chamber 101 through exhaust port 104.

VD reactor 100 includes means for supplying energy to the reactable constituents in the process gases in chamber 101 on the surface of the substrate 102. The supplied energy causes the reactable constituents to react or decompose and deposit a thin film onto an upper surface of substrate 102. In one embodiment, the supplied energy includes thermal energy supplied by heat lamps 106. In the illustrated example, lamps 106 are positioned in the base of chamber 101. Heat lamps 106 emit a significant amount of near-infra red radiation that passes through susceptor 107 to heat substrate 102. Alternatively, susceptor 107 can be heated by heat lamps 106 and substrate 102 can be heated by conduction from susceptor 107. The heat lamps 106 may be placed at alternate locations according to the parameters of the specific deposition process being performed according to the present invention.

Another embodiment supplies reaction energy by a radio frequency (RF) generator 108 as shown in FIG. 1. RF generator 108 creates a RF field between substrate 102 and an anode. In the embodiment shown in FIG. 1, susceptor 107 is grounded while the RF signal is applied to a process gas manifold 109. Alternative and equivalent VD reactor designs will be understood by reading the disclosure. An RF anode may be provided separately (not shown) and process gas manifold 109 may be electrically isolated from the RF supply. For example, the RF signal can be applied to susceptor 107 and process gas manifold 109 can be grounded.

In general, the energy sources 106 and 108 are intended to provide sufficient reaction energy in a region near the surface of substrate 102 to cause decomposition and/or reaction of the constituents of the present gas to deposit the metal, dielectric, or insulator species in the process gases onto a surface of the substrate. One of ordinary skill in the art will understand upon reading the disclosure that any one, combination, or equivalent of the above can be employed to provide the necessary reaction energy.

One embodiment includes plasma reactors because these allow film deposition at lower temperatures and are used in the semiconductor industry. However, some reactant constituents in the process gases may deposit at low temperatures using only thermal energy or other energy sources. Hence, the invention encompasses reactor designs using any energy source including either thermal heating, RF plasma, or the like.

VD reactor 100 is illustrated as a single wafer reactor, but it should be understood that the invention is applicable to batch reactors.

Furthermore, VD reactor 100 includes associated control apparatus (not shown) for detecting, measuring and controlling process conditions within VD reactor 100. Associated control apparatus include, as examples, temperature sensors, pressure transducers, flow meters and control valves. Associated control apparatus further include other devices suitable for the detection, measurement and control of the various process conditions described herein.

Figure 2:
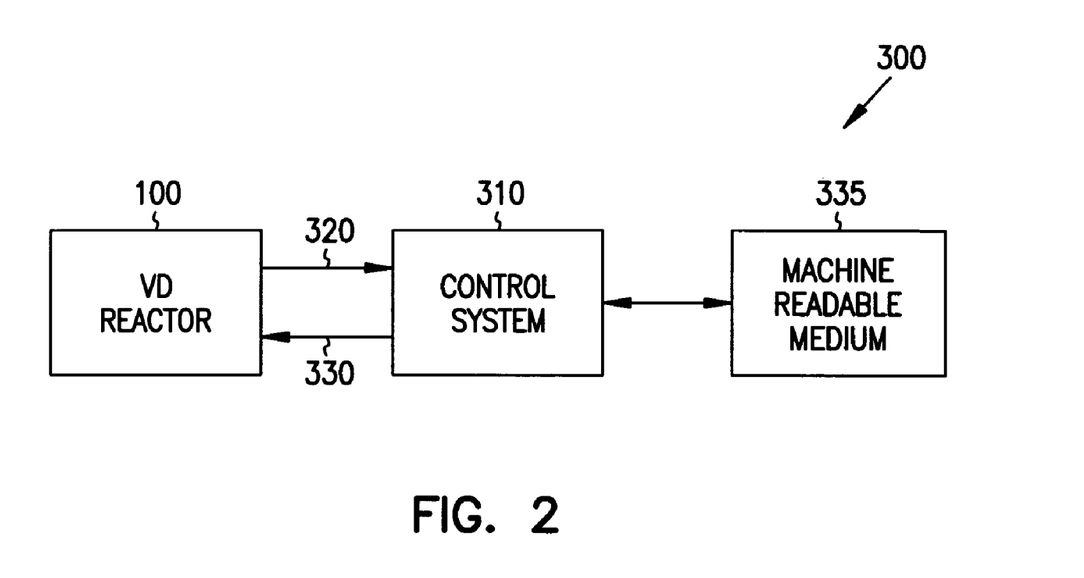
FIG. 2 is a block diagram of a sequential pulse deposition system of one embodiment of the invention.

FIG. 2 represents a VD system 300 suitable for practicing the invention. VD system 300 contains the VD reactor 100 and a control system 310. VD reactor 100 and control system 310 are in communication such that process information is passed from VD reactor 100 to control system 310 through communication line 320, and process control information is passed from control system 310 to VD reactor 100 through communication line 330. It is noted that communication lines 320 and 330 may represent only one physical line, in which communications are bidirectional.

The control system 310 may include, integrally or separatable therefrom, a machine readable media 335 which contains instructions for performing the present invention. Media 335 may be an electrical, magnetic, optical, mechanical, etc. storage device that stores instructions that are read by control system 310. Such storage devices include magnetic disks and tape, optical disks, computer memory, etc. Control system 310 may also include a processor (not shown) for issuing instructions to control reactor 100 based upon instructions read from machine readable media 335.

Figure 3:
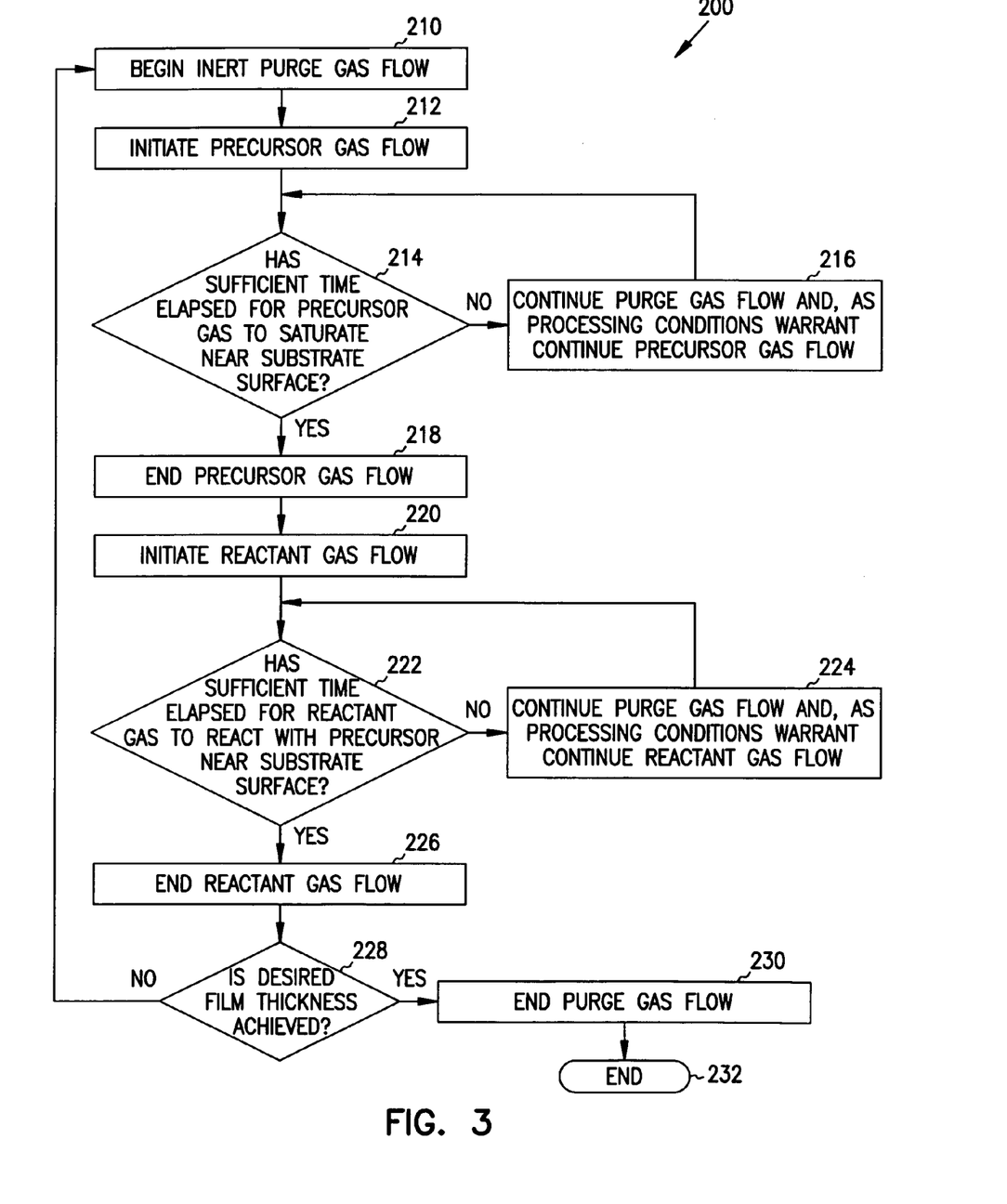
FIG. 3 is a flowchart of one embodiment of the invention.

FIG. 3 depicts a flowchart 200 of one embodiment of a sequential pulse deposition (SPD) process of the invention. SPD, in the illustrated embodiment, begins by initiating an inert purge gas flow through a reactor (210). The purge gas maintains the chamber at a generally constant pressure. In one embodiment of the present invention the purge gas flow is pulsed, for example only injecting purge gas between other gas pulses. In another embodiment, purge gas is not used at all, i.e. step 210 is not performed.

The precursor gas containing a metal, dielectric, or insulator to be deposited on the substrate now flows into the reaction chamber (212). The metals include, for example, rhenium, ruthenium, rhodium, palladium, silver, osmium, iridium, platinum and gold. The metals can also include alloys of these metals or other metal that one of ordinary skill would deposit on a substrate. The precursor gas flow continues until a volume closely adjacent the surface of the substrate on which the metal, dielectric, or insulator will be deposited is saturated by the precursor gas (214). According to the teachings of the present invention, the precursor gas saturates the topology of the substrate so that adequate precursor material is adjacent the substrate surface by the precursor gas entering and filling the steps, trenches, and holes. One of ordinary skill will understand the same upon reading the disclosure. The precursor gas flow, as well as purge gas flow if present, continues until the required saturation occurs depending on the processing conditions dictated by the type of substrate and precursor gas, and the topology of the substrate (216). A substrate having numerous or high aspect steps may require a longer precursor gas flow period than a substrate which has few steps or relative low aspect steps. One advantage of the present invention is that unlike conventional ALD it is not necessary for the precursor gas to bond with the surface of the substrate, i.e. chemisorption is not required. In fact, chemisorption is limited by the temperature at which SPD occurs. Chemisorption typically occurs generally below 300 degrees C. and usually below 200 degrees C. The temperature in chamber 101 for SPD is typically at least 300 degrees C. and can be significantly higher. However, in some embodiments, the temperature may be as low as 100 degrees Celsius, whereat the reaction of the precursor and the reactant dominate the process growing the film on the substrate.

Precursor gas flow ends once the precursor gas saturates adjacent the substrate according to the processing conditions of the present deposition (218). Another advantage of the present invention is that, in contrast to ALD, it is not necessary to completely purge the reaction chamber after stopping the precursor gas flow. After or substantially at the same time precursor gas flow is stopped, reactant gas flow (for example, $N_2O$) begins in the reaction chamber (220). Reactant gas continues to flow into the reaction chamber until the reactant gas saturates the volume adjacent the surface of the substrate on which the substance in the precursor gas will be deposited (222). The precursor gas and the reactant gas chemically react and deposit the desired material in a layer on the substrate. Again in contrast to ALD, the deposited layer is more than one atomic layer thick. This overcomes the significant drawback of ALD by providing a faster layer growth time than ALD. SPD further provides adequate step coverage and uniformity of the film even in such a shortened film growth time, relative to conventional CVD, by first having precursor gas in the volume adjacent the substrate surface and then injecting reactant gas into the reaction chamber. SPD thus provides a significant improvement over conventional CVD.

The present process may continue the purge gas flow while the reactant gas flows into the reaction chamber (224). In contrast to ALD, it is not necessary to completely purge the reaction chamber of reaction gas after stopping its flow. Once a sufficient quantity of reaction gas is present to complete the reaction with the precursor to deposit a layer on the substrate, reaction gas flow ends (226). Purge gas flow may continue to partially flush the residual reaction and precursor gases and the by-product gas of the precursor and reactant reaction from the reaction chamber. If the desired film thickness has been achieved (228), then the purge gas flow ends (230) usually after the remnants of the precursor, reactant, and by-product gases are purged from the chamber. The process terminates at box 232. The reader should note that process termination may comprise initiation of further processing and does not necessarily require shutdown of the reactor, e.g. the above sequence of steps can be repeated. While one embodiment of the invention includes all of the above steps, the present invention includes other embodiments which do not include all of the above steps.

If the desired thickness of the layer has not been achieved (228), then the process returns to step 212 and begins another cycle. The process then reiterates the above sequence/process until step 228 determines that the layer has the desired thickness.

A cycle of pulsing the reactant gas and the precursor gas and allowing the gases form a film on the substrate grows a film on the substrate at a rate greater than or equal to 5 Å/cycle. In some embodiments, the growth rate has been equal to about 100 Å/cycle. The cycle length depends on the injection time of the precursor gas and the reactant gas, as well as any delay between injecting the gas following the prior injected gas.

Figure 4:
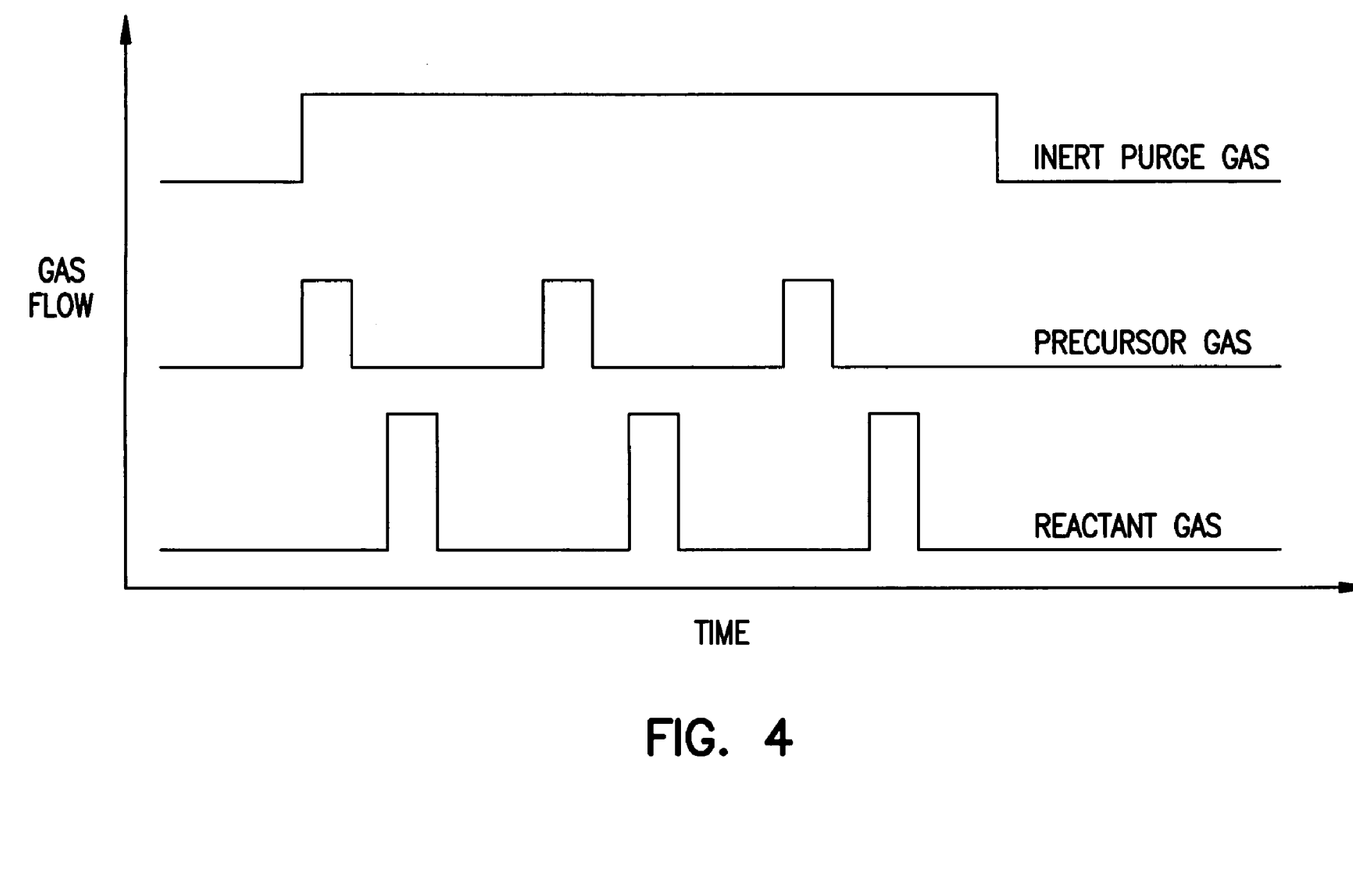
FIG. 4 is a timing diagram of one embodiment of the process of the invention.

One embodiment of the present inventive process is shown in FIG. 4. The process begins with the flow of an inert purge gas and a precursor gas into the reaction chamber. The precursor gas flows into the chamber until a sufficient quantity of precursor is adjacent the substrate as determined by stoichiometry of the particular reaction needed to deposit the desired film on the substrate. The precursor must include a certain minimum amount of the metal component to be deposited on a wafer and other reactive components that assist in the depositing the metal component on the wafer. The precursor may flow into the reactor in a quantity greater than determined by the stoichiometry of the reaction. One embodiment of the precursor gas is a noble metal or an alloy of such a noble metal. Specific embodiments of the precursor gas include Pt, Rh, rhenium, ruthenium, rhodium, palladium, silver, osmium, iridium, platinum, and gold. In this embodiment, the precursor gas flow ends followed by a short period of only purge gas flow. The reactant gas flows into the chamber until a sufficient quantity of reactant gas is available to react with the precursor at the surface of the substrate to deposit the desired film. Some specific embodiments of the reactant gas include $N_2O$, $O_2$, and $H_2$. Other embodiments of reactant gases include $H_2O$, NO, and O. Like the precursor gas flow, the reactant gas and its flow reaches or exceeds the quantity that is determined by the stoichiometry of the particular reaction. Thereafter, the reactant gas flow stops. In this embodiment, only the purge gas now flows into the chamber. It is noted that unlike ALD it is not necessary to completely purge the chamber before the next gas begins flowing into the chamber. Moreover, SPD requires that the precursor remain in the chamber until the chemical reaction with the reactant gas occurs and the film is deposited on the substrate. This process can be repeated until a film of a desired thickness is deposited on the substrate.

The amounts of either the precursor gas or the reactant gas meets or exceeds the amount of material required by the stoichiometry of the particular reaction. That is, the amount of precursor or reactant gas flow, in certain embodiments, provides excess mass in the reactor. The excess mass is provided to ensure an adequate reaction at the surface of the wafer. In this embodiment, the ratio of precursor or reactant components in the gas phase usually is different than the stoichiometry of the film.

Figure 5:
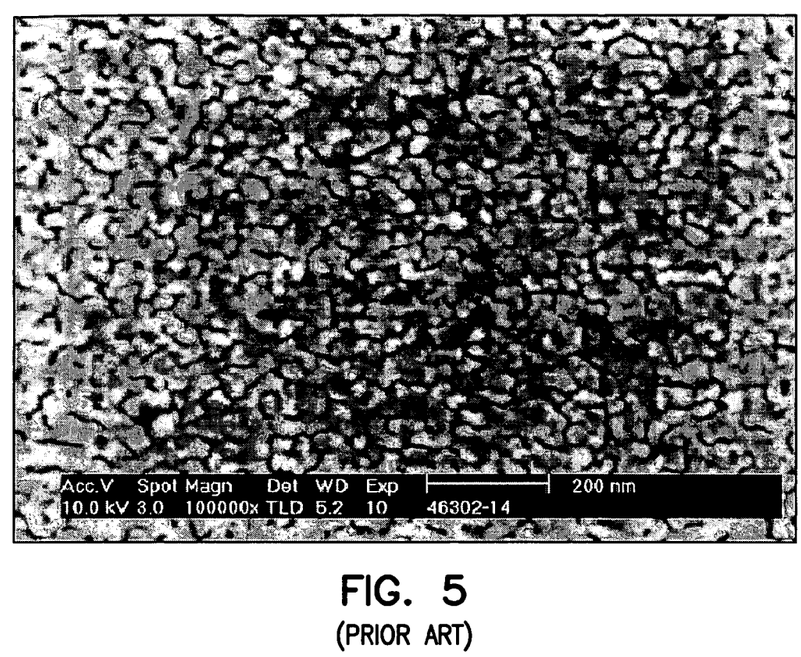
FIG. 5 is a micrograph of a top planar view of the surface of a platinum film deposited by conventional CVD.

Reference is now made to FIG. 5, it is a plan view showing the morphology of a PtRh film deposited by conventional CVD. As the FIG. 5 micrograph shows, the film deposited by CVD has discontinuities and poor film coverage. This results in a less desirable structure and requires the fabrication of a thicker film to achieve the desired performance characteristics.

Figure 6:
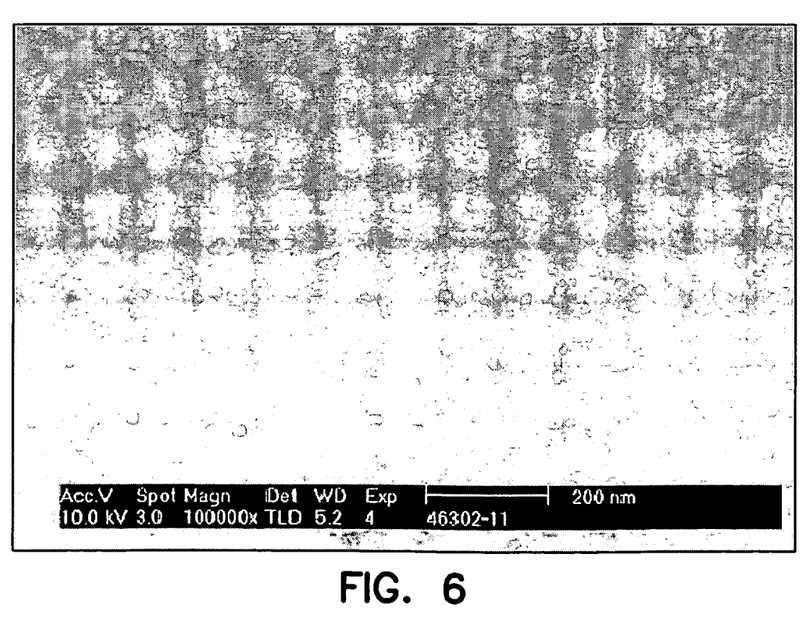
FIG. 6 is a micrograph of a top planar view of a platinum film deposited by sequential pulse deposition according to the teachings of the present invention.

FIG. 6 is a plan view showing the morphology of a PtRh alloy film deposited by SPD. As clearly shown in FIG. 6, the SPD deposited film has superior coverage with fewer discontinuities and more uniform nucleation. Obviously, the SPD film has superior performance characteristics.

Figure 7:
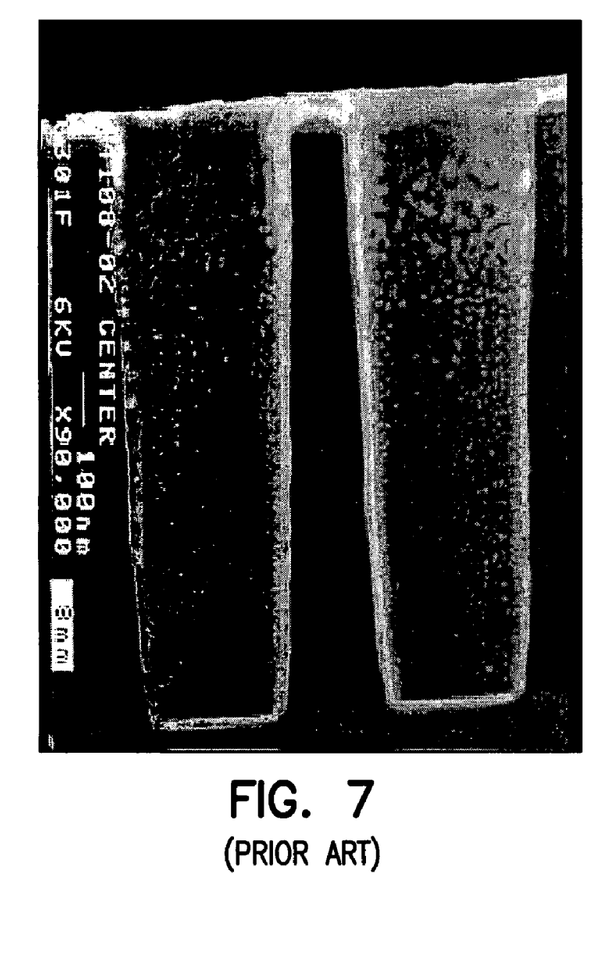
FIG. 7 is a micrograph of a cross-sectional view of a platinum film deposited by conventional CVD.

Reference is now made to FIG. 7, it is a cross sectional view showing the step coverage of a PtRh alloy film deposited by conventional CVD. The film deposited by conventional CVD exhibits relatively poor step coverage. Specifically, it is non-uniform with the thickness at the bottom of the step being significantly thinner than at the top of the hole.

Figure 8:
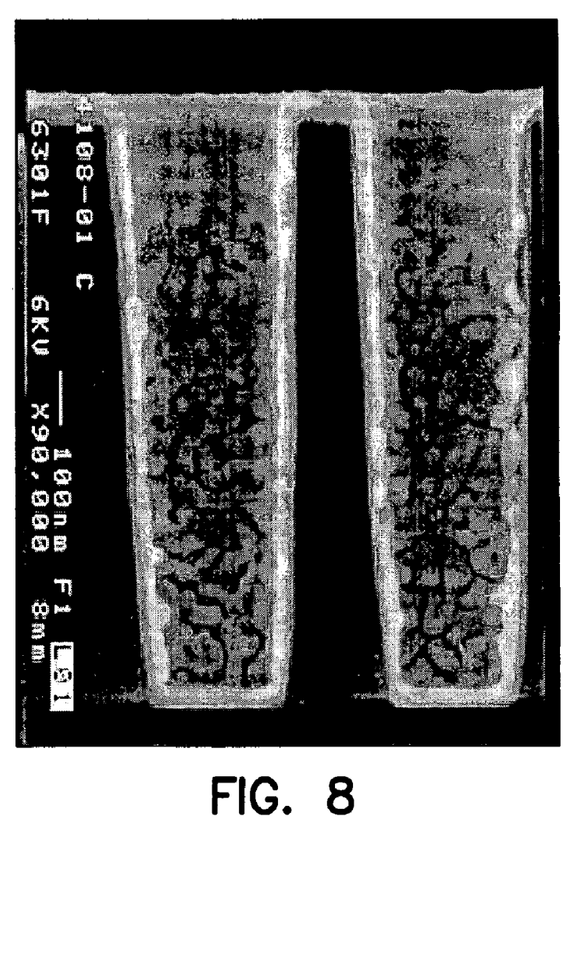
FIG. 8 is a micrograph of a cross-sectional view of a platinum film deposited by sequential pulse deposition according to the teachings of the present invention.

FIG. 8 is a cross sectional view showing a PtRh alloy film deposited by SPD, which has a better step coverage exhibited by the more uniform film extending from the top of the hole to the bottom of the hole. Obviously, the SPD film has superior performance characteristics.

While the above described embodiments describe first injecting the precursor gas and then injecting the reactant gas, it will be understood that it is within the scope of the present invention to first inject the reactant gas such that it saturates the volume adjacent the substrate and then inject the precursor. The precursor will enter the volume and react with the already present reactant gas and form a film on the substrate.

CONCLUSION

Thus, the present invention provides novel structures and methods for fabrication of thin films on substrates. The novel fabrication method of the present invention sequentially injects a precursor and a reactant into a reaction chamber. In a conventional CVD fabrication techniques, the precursor and reactant are overlappingly injected into a reaction chamber increasing gas phase reactions remote from the surface of the substrate. This inefficiently uses the precursor and reactant in reactions remote from the substrate and produces contaminants in the reaction chamber. In conventional ALD, films are grown at a slow rate which results in a poor fabrication rate. Moreover, ALD requires a complete purge before injecting the next precursor pulse. According to the teachings of the present invention, there is reduced gas phase interactions of the precursor and the reactant and more than one atomic layer can be deposited on the substrate during each cycle. This results in a faster fabrication rate and in improved step coverage for deposited thin films.

While the above description specifically references certain metals as the precursor and certain gases as reactants, it will be understood that the present invention is not limited to these examples. The present invention is adaptable to depositing metal, dielectric, or insulative layers on a substrate. In other words, SPD can be used to deposit films that require two or more reactable gases to be present in the reaction chamber. It is to be further understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A non-transitory machine readable medium having instructions stored thereon, comprising:
    first instructions for causing a chemical vapor deposition reactor to initiate depositing a film on a substrate by injecting a pulse of precursor gas into a reaction chamber;
    second instructions for injecting a purge gas flow to the chemical vapor deposition reactor; and
    third instructions
        for determining a reactant gas pulse time,
            the reactant gas pulse time being
                after the pulse of precursor gas has been injected into the reaction chamber and
                prior to complete purge of the precursor gas, and
        for causing the reactor to inject a pulse of reactant gas into the reaction chamber at the reactant gas pulse time.

2. The machine readable medium of claim 1, further comprising:
    further instructions for causing the reactor to continue sequentially injecting pulses of precursor gas and reactant gas until the deposited film has attained a selected thickness.

3. The machine readable medium of claim 2, wherein the third instructions include a delay during which neither the precursor gas nor the reactant gas are injected into the reaction chamber.

4. The machine readable medium of claim 1, wherein the first instructions further comprise:
   instructions for ending the pulse of precursor gas prior to proceeding to the second instructions.

5. The machine readable medium of claim 1, further comprising:
   fourth instructions for holding the chamber at approximately a constant pressure.

6. The machine readable medium of claim 1, wherein the first instructions cause the chemical vapor deposition reactor to inject a precursor gas having a metal constituent that will be deposited on the substrate.

7. The machine readable medium of claim 1, further comprising:
   fourth instructions for heating the reaction chamber above approximately 300 degrees C.

8. The machine readable medium of claim 1,
   wherein the instructions stored on the machine readable medium are such that the second instructions issue before the first instructions.

9. A non-transitory machine readable medium that provides instructions that are executable by a processor, comprising:
   first instructions for providing a precursor gas to a reaction chamber that contains a semiconductor substrate;
   second instructions for providing a purge gas flow to the reaction chamber; and
   third instructions
      for determining a reactant gas pulse time,
         the reactant gas pulse time being
            after the precursor gas has been provided to the reaction chamber and
            prior to complete purge of the precursor gas, and
      for providing a reactant gas after the precursor gas has been provided to the reaction chamber at the reactant gas pulse time,
   wherein the precursor gas and the reactant gas are sequentially provided to the reaction chamber until a predetermined thickness of a selected material is deposited on the semiconductor substrate.

10. The machine readable medium of claim 9, wherein the second instructions further comprise:
    instructions for introducing at least one of helium, argon and nitrogen as a purge flow gas.

11. The machine readable medium of claim 9, further comprising:
    fourth instructions for controlling an elapsed time for providing at least one of the precursor gas and the reactant gas to the reaction chamber.

12. The machine readable medium of claim 9, further comprising:
    fourth instructions for controlling at least one of an energy transfer to the reaction chamber, a pressure within the reaction chamber, and a temperature within the reaction chamber.

13. The machine readable medium of claim 12, wherein the fourth instructions further comprise:
    instructions for maintaining the temperature within the reaction chamber to at least approximately 300 degrees C.

14. The machine readable medium of claim 12, wherein the fourth instructions further comprise:
    instructions for maintaining an approximately constant pressure within the reaction chamber.

15. The machine readable medium of claim 12, wherein the fourth instructions further comprise:
    instructions for controlling at least one of a radio frequency (RF) generator and a thermal lamp.

16. The machine readable medium of claim 11, wherein the fourth instructions further comprise:
    instructions for specifying a time period between stopping the flow of the precursor gas and initiating the flow of the reactant gas.

17. The machine readable medium of claim 11, wherein the fourth instructions further comprise:
    instructions for specifying a time sufficient to saturate a surface topology of the semiconductor substrate with the precursor gas.

18. The machine readable medium of claim 11, wherein the fourth instructions further comprise:
    instructions for specifying a time sufficient to saturate a surface topology of the semiconductor substrate with a reactant gas.

19. The machine readable medium of claim 9, wherein the first instructions further comprise:
    instructions for identifying a stoichiometric amount of the precursor gas, and providing at least the stoichiometric amount of the precursor gas to the reaction chamber.

20. The machine readable medium of claim 9, wherein the third instructions further comprise:
    instructions for identifying a stoichiometric amount of the reactant gas, and providing at least the stoichiometric amount of the reactant gas to the reaction chamber.

21. The machine readable medium of claim 9,
    wherein the instructions stored on the machine readable medium are such that the second instructions issue before the first instructions.

22. A non-transitory machine readable medium having stored thereon a program that is executable by a processor to control a material deposition onto a semiconductor substrate, comprising:
    a first program module including instructions to supply
       a precursor gas,
       a purge gas, and
       a reactant gas
    to a reaction chamber that contains a semiconductor substrate, and
    including instructions to determine a reactant gas supply time,
       the reactant gas supply time being
          after the precursor gas has been supplied to the reaction chamber and
          prior to complete purge of the precursor gas,
       the reactant gas being supplied at the reactant gas supply time; and
    a second program module including instructions to control a processing condition within the reaction chamber while the material deposition is occurring.

23. The machine readable medium of claim 22, wherein the first program module further comprises:
    instructions for controlling an elapsed time for providing the precursor gas and the reactant gas to the reaction chamber.

24. The machine readable medium of claim 22, wherein the first program module further comprises:
    instructions for providing a time period between the interruption of the precursor gas and the introduction of the reactant gas into the reaction chamber.

25. The machine readable medium of claim 22, wherein the instructions included in the first program module and the instructions included within the second program module are repetitively executed until a selected material thickness is deposited on the substrate.

26. The machine readable medium of claim 22, wherein the first program module further comprises:
  instructions for specifying a time sufficient to saturate a surface topology of the semiconductor substrate with the precursor gas.

27. The machine readable medium of claim 22, wherein the first program module further comprises:
  instructions for specifying a time sufficient to saturate a surface topology of the semiconductor substrate with the reactant gas.

28. The machine readable medium of claim 22, wherein the first program module further comprises:
  instructions for identifying a stoichiometric amount of the precursor gas, and providing at least the stoichiometric amount of the precursor gas to the reaction chamber.

29. The machine readable medium of claim 22, wherein the first program module further comprises:
  instructions for identifying a stoichiometric amount of the reactant gas, and providing at least the stoichiometric amount of the reactant gas to the reaction chamber.

30. The machine readable medium of claim 22, wherein the second program module further comprises:
  instructions for controlling at least one of an energy transfer to the reaction chamber, a pressure within the reaction chamber, and a temperature within the reaction chamber.

31. The machine readable medium of claim 30, wherein the second program module further comprises:
  instructions for controlling at least one of a radio frequency (RF) generator and a thermal lamp to control the energy transfer to the reaction chamber.

32. The machine readable medium of claim 30, wherein the second program module further comprises:
  instructions for maintaining an approximately uniform pressure within the reaction chamber.

33. The machine readable medium of claim 30, wherein the second program module further comprises:
  instructions for maintaining an approximately uniform temperature within the reaction chamber.

34. The machine readable medium of claim 33, wherein the second program module further comprises:
  instructions for maintaining a temperature within the reaction chamber to at least approximately 300 deg. C.

35. The machine readable medium of claim 22, wherein the first program module further comprises:
  instructions to supply a precursor gas including a metal, a dielectric and an insulator.

36. The machine readable medium of claim 35, wherein the first program module further comprises:
  instructions to supply a precursor gas that includes at least one of rhenium, ruthenium, rhodium, palladium, silver, osmium, iridium, platinum and gold.

37. The machine readable medium of claim 22, wherein the first program module further comprises:
  instructions to supply a reactant gas that includes nitrous oxide.

38. The machine readable medium of claim 9,
  wherein the first program module causes the instructions to supply the purge gas to issue before the instructions to supply the precursor gas.

* * * * *